United States Patent [19]
King

[11] 3,962,714
[45] June 8, 1976

[54] SEMICONDUCTOR OPTICAL MODULATOR

[75] Inventor: Frederick David King, Smith Falls, Canada

[73] Assignee: Northern Electric Company Limited, Montreal, Canada

[22] Filed: Sept. 19, 1974

[21] Appl. No.: 507,451

[52] U.S. Cl. ................................. 357/19; 357/16; 357/18; 350/160 R
[51] Int. Cl.² ................. H01L 31/12; H01L 31/16; H01L 29/161
[58] Field of Search ................ 350/160 R, 161; 250/552; 357/17, 18, 19, 16

[56] References Cited
UNITED STATES PATENTS

| | | | |
|---|---|---|---|
| 3,656,836 | 4/1972 | de Cremoux | 350/160 |
| 3,724,926 | 4/1973 | Lee | 350/160 |
| 3,758,875 | 9/1973 | Hayashi | 331/94.5 |
| 3,791,717 | 2/1974 | Honda | 350/160 |

*Primary Examiner*—Martin H. Edlow
*Attorney, Agent, or Firm*—Sidney T. Jelly

[57] ABSTRACT

An optical modulator comprises a metal insulator semiconductor diode having a predetermined reverse bias. In a particular form the modulator comprises an active layer and a confining layer epitaxially grown sequentially on a substrate. In a particular application a monolithic light emitting diode — modulator structure can be formed.

6 Claims, 5 Drawing Figures

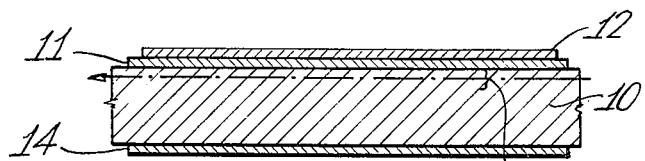
Fig-1-
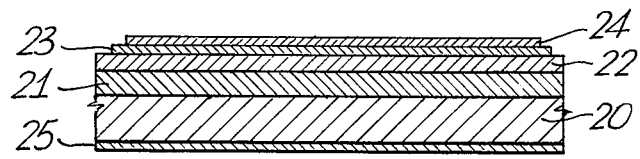
Fig-2-
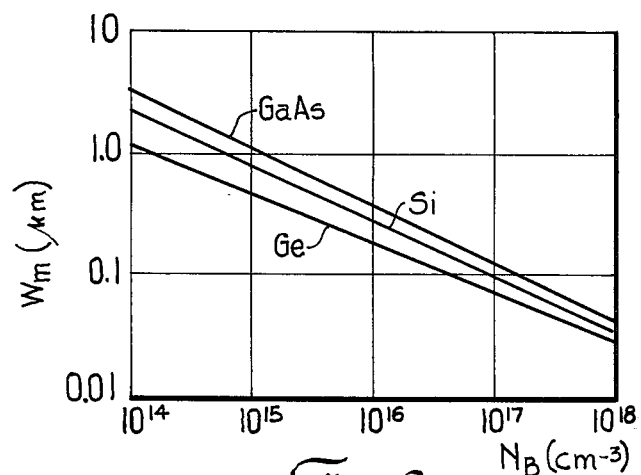
Fig-3-
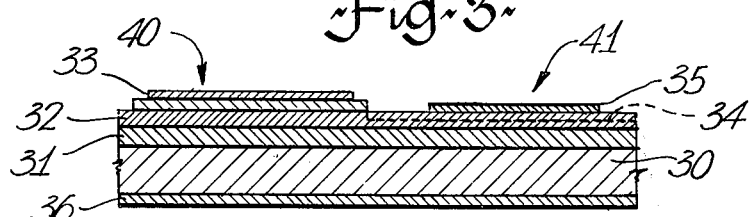
Fig-4-
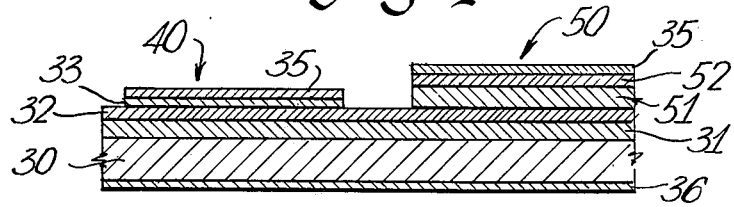
Fig-5-

SEMICONDUCTOR OPTICAL MODULATOR

This invention relates to a semiconductor optical modulator, particularly a metal insulator semiconductor, and to an optical emitter/modulator structure incorporating a metal insulator semiconductor diode.

Electroabsorption occurs in reverse biased p-n junctions and such absorption can be employed to obtain modulation of an infra-red beam. As an alternative to a p-n junction it is proposed that a metal-insulator-semiconductor (hereinafter referred to as M.I.S.) diode be used in obtaining the high electric fields which produce the bandgap shift required for absorption modulation.

Thus the present invention provides an optical modulator comprising an M.I.S. diode and also provides an optical emitter-modulator structure using an M.I.S. diode as the modulator.

The invention will be readily understood by the following description of one form of modulator, by way of example, and a structure embodying a modulator in accordance with the present invention, in conjunction with the accompanying diagrammatic drawings in which:-

FIG. 1 is a cross-section through a structure, normal to the surface thereof;

FIG. 2 illustrates a structure similar to that of FIG. 1, forming a modulator;

FIG. 3 is a curve illustrating the relationship between the maximum depletion layer thickness and impurity concentration in the semiconductor layer;

FIGS. 4 and 5 illustrate two arrangements incorporating a modulator in accordance with the present invention.

FIG. 1 illustrates a basic form of structure, comprising a layer or substrate 10 of undoped or lightly doped GaAs, for example, on which a layer 11 of an insulator having a high dielectric strength is formed. A typical thickness of layer 11 is approximately 1000A. A metal contact layer 12 is placed on the layer 11. By applying a suitable bias to the metal contact layer 12 the surface of the semiconductor may be brought into a state of accumulation, depletion or inversion with consequent creation of a region of high electrical field close to the semiconductor metal interface. Typically, for a layer or substrate 10 of GaAs having a doping density of $5 \times 10^{15}/cm^3$ the high field region, indicated at 13, should reach a depth of approximately $5\mu$. It is this high field region that is employed to obtain electroabsorption - modulation. A further contact layer 14 is formed on the undersurface of the substrate 10.

FIG. 2 illustrates a grown structure using the features of FIG. 1. Thus on a substrate 20 of semiconductor material of one conductivity type, a confining layer 21 of GaAlAs, of n type for example is grown. Layer 21 has a doping density of approximately $10^{18}/cm^3$ and having the same doping type as the substrate 20. On layer 21 is formed an active layer 22. Layer 22 is a semiconductor layer, consisting of undoped or lightly doped GaAs having the same doping type as layer 21 and substrate 20, and having a thickness approximately equal to the maximum depletion layer width for the corresponding doping concentration. FIG. 3 gives the maximum thickness of the depletion layer relative to doping or impurity concentration for GaAs, and also Ge and Si.

On layer 22 is formed layer 23 of an insulator having an index of refraction lower than that of layer 22. The thickness of layer 23 is typically about 1000A and has a high dielectric strength and a low refractive index. In addition, the insulating layer 23 suitable for the manufacture of the M.I.S. modulator should have the following properties:- (a) high resistance to diffusion of metallic ions under high electric field; (b) high resistance to thermal diffusion of doping impurities, (c) high electrical resistance. Also the presence of the insulating layer should not produce a large number of charged surface states at the semiconductor surface. Some insulators are $Si_3N_4$; silicon oxynitride; $Al_2O_3$; thermally or anodically grown oxides of GaAs, and phosphorus doped $SiO_2$. Finally a metal contact layer 24 is formed on the insulating layer 23, and a contact layer 25 is formed on the undersurface of the substrate. The bias is applied to the structure by means of the contact layers 24 and 25.

A modulator in accordance with the present invention has several potential advantages. It is easy to fabricate — only two grown layers — layers 21 and 22 of FIG. 2 — are required. There is strong optical confinement, by virtue of the large change in refractive index at the semiconductor/insulator interface. The structure is versatile — fields of either polarity may be produced in the modulating region. By switching the confining region from a state of depletion to one of heavy accumulation or inversion, modulation of light signals having wavelengths smaller than the bandgap can be obtained by free carrier absorption. The device can readily be incorporated in a monolithic package, two examples of such packages being illustrated in FIGS. 4 and 5.

FIG. 4 illustrates a diffused light emitting diode/-modulator structure. The structure comprises a substrate 30, for example of n type. On the substrate 30 is grown a confining layer 31 of n type GaAlAs and on layer 31 is grown an active layer 32 of lightly doped GaAs, n type. A layer 33 — an insulating layer — is grown on layer 32. Layer 33 extends over only part of layer 32, the modulator region 40. This can be obtained by masking before growing layer 33, or by growing layer 33 over all the surface of layer 32, masking and stripping that part of layer 33 not required. The structure is then diffused to produce a p type region in the upper part of layer 32 not under layer 33, the emitter region 41, thus producing a p-n junction 34 in this part of layer 32. Conveniently the layer 33 can be used as a mask during the diffusion to prevent diffusion of the remainder of layer 32. Finally a metal layer 35 is formed on the insulating layer 33, and also on the uncovered part of layer 32. The metal layer 35 can be formed over the whole area of the structure and then photolithographically etched to form the two separated areas as shown or masking can be applied to the structure before forming the layer 35. A metal contact layer 36 is formed on the undersurface of the substrate 30.

FIG. 5 illustrates a further form of light emitting diode/modulator structure, the light emitting diode in the form of a double heterostructure. The modulator region or section is as in FIG. 4 and is indicated at 40, and comprises the confining layer 31, active layer 32, metal insulator layer 33 and metal contact layer 35. The layers 31 and 32 extend across the substrate 30 to the emitter region indicated at 50. On the active layer 32 is grown a GaAlAs confining layer 51, a GaAs capping layer 52 and again metal contact layer 35.

Referring back to FIG. 2, which as stated is a modulator, the structure is prepared as follows. On the substrate 20, the confining layer 21 and active layer 22 are grown by liquid phase epitaxy. This can conveniently be carried out separately by loading substrate wafers in a carbon slider which passes under reservoirs containing saturated solutions, doped to the desired characteristics. Briefly, a substrate wafer, after preheating to a predetermined temperature, in a preheating zone for example, is positioned beneath a first reservoir containing a solution having the composition 4 gm Ga : 250mg GaAs : 6mg Al : 2mg Te : 100mg GaP, the temperature of solution and substrate at the predetermined temperature — typically 830°C. The solution and substrate is cooled through the range 830° – 820°C to give a layer of approximately 5μ thick, of composition ~$Ga_{0.65}Al_{0.35}As_{0.98}P_{0.01}$, and a doping level ~$10^{18}$. The substrate is then moved below a second reservoir containing a solution having the composition 4gm Ga : 350mg GaAs : 1mg Sn, and the solution and substrate is cooled through the range 820° – 819°C to give a layer approximately 1μ thick of GaAs composition and doped to ~$10^{15}$. Typical arrangements for growing epitaxial layer sequentially are described in "Preparation of GaAs p-n Junctions by Multiple Layer Liquid Phase Epitaxy" by B. I. Miller and H. C. Casey Jr, paper 24 1972 Symposium on GaAs, and in Canadian Pat. No. 902,803 issued June 13, 1972.

Following growth of the layers 21 and 22, the substrate wafers are cleaned to remove excess GaAs. Dielectric layer 23 is then formed by depositing $SiO_2$ to a thickness of approximately 2000A. A contact layer 25 is then formed by depositing 2–5KA of Au/Ge on the substrate followed by alloying at approximately 450°C for 3 minutes in a nitrogen atmosphere. Layer 24 is then formed by depositing approximately 2000A of Al. The substrate wafer can then be divided into chips to form individual modulators.

Conveniently, a plurality of devices are formed on single substrate at one time. Thus, for example, a number of monolithic light emitting diode/modulator structures as illustrated in FIG. 4 are made at one time, a typical procedure being as follows:- On the substrate 30 are grown epitaxial layers 31 and 32 in a manner similar to the growing of 21 and 22 of FIG. 2. After cleaning there is deposited the dielectric layer 33 of $SiO_2$ containing 30X/0 $P_2O_5$, to a thickness of 2000A. A plurality of 125μ diameter holes are then photolithographically engraved on the dielectric layer 33. Each hole represents an emitter or light emitting diode region 41. Holes are then etched through layer 33 by immersion in buffered hydrofluoric acid for 1 minute. The whole structure is then diffused to a depth of approximately 0.3μ at 600°C for 15 minutes in a sealed capsule containing $Z_nAs_2$. This forms junction 34 in each of the emitter regions 41.

The substrate is then lapped to a total thickness of 100μ, following which layer 36 is formed by evaporation of approximately 2.5KA Au/Ge and then alloying at 450°C for 3 minutes. Layer 35 is then formed by evaporating approximately 2000A of aluminum. This is followed by photolithographically etching an annulus around each of the holes previously formed in dielectric layer 33, the annulus having an interior diameter of 100μ and exterior diameter of 150μ. This forms the isolation between emitter regions 41 and modulator regions 40. Etching is in phosphoric acid at 60°C for 1 minute. The substrate is then divided into chips.

Manufacture of monolithic devices of the form illustrated in FIG. 5 is similar to that described above for FIG. 4, except that the four layers 31, 32, 51 and 52 are first epitaxially grown and then layers 51 and 52 removed at all areas except where emitter regions 41 are to be formed. No diffusion step is required with this structure. Layer 51 consists of P-type $Ga_{0.65}Al_{0.35}As_{0.98}P_{0.01}$ having a thickness of approximately 1μ and a doping density of about $5 \times 10^{17}$. Layer 52 consists of P-type GaAs having substantially the same thickness and doping density as layer 51.

What is claimed is:

1. A semiconductor optical modulator, comprising:
    a substrate of GaAs semiconductor material, of one conductivity type;
    a confining layer of highly doped GaAlAs semiconductor material on said substrate, said confining layer of the same conductivity type as said substrate;
    an active layer of low doping level GaAs semiconductor material on said confining layer, said active layer of the same conductivity type as said confining layer;
    an insulating layer on said active layer, said insulating layer of high dielectric strength and having a lower refractive index than said active layer; and
    means for applying a variable bias to said insulating layer, whereby light passing through the active layer is modulated on application of said variable bias.

2. A modulator as claimed in claim 1, said confining layer having a doping density of approximately $10^{18}$/cm.

3. A modulator as claimed in claim 1, said active semiconductor layer being undoped.

4. A modulator as claimed in claim 1, said active semiconductor layer of a thickness approximately equal to the maximum depletion layer width for the doping concentration of the semiconductor layer.

5. A semiconductor optical modulator structure including a light emitting diode and a modulator on a common substrate, comprising:
    a substrate of GaAs semiconductor material, of one conductivity type and having top and bottom surfaces;
    a confining layer of highly doped GaAlAs semiconductor material on the top surface of said substrate, said confining layer common to said light emitting diode and said modulator and of the same conductivity type as said substrate;
    an active layer of low doping level GaAs semiconductor material on said confining layer, said active layer common to said light emitting diode and said modulator and of the same conductivity type as said confining layer;
    a diffused region in an upper part of said active layer for said light emitting diode, said diffused region of a conductivity type opposite to the conductivity type of the remainder of said active layer to produce a p-n junction in said light emitting diode;
    an insulating layer on said active layer for said modulator, said insulating layer separated from said diffused region and having an index of refraction lower than said active layer; and
    means for applying a bias voltage to said diffused region and a variable bias to said insulating layer whereby light emitted from the light emitting diode is modulated in the active layer of the modulator on application of the variable bias to said insulating layer.

6. A semiconductor optical modulator structure as claimed in claim 5, including a further confining layer of GaAlAs semiconductor material on said active layer, said further confining layer extending for said light emitting diode only and separated from said metal insulator layer of said modulator; a capping layer on said further confining layer and a contact layer on said capping layer.

* * * * *